(12) United States Patent
Tseng

(10) Patent No.: US 6,429,123 B1
(45) Date of Patent: *Aug. 6, 2002

(54) METHOD OF MANUFACTURING BURIED METAL LINES HAVING ULTRA FINE FEATURES

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 58 days.

This patent is subject to a terminal disclaimer.

(21) Appl. No.: 09/679,270

(22) Filed: Oct. 4, 2000

(51) Int. Cl.$^7$ .......................................... H01L 21/4763
(52) U.S. Cl. ...................... 438/642; 438/642; 438/639; 438/638; 438/637; 438/239; 438/243; 257/68; 257/71
(58) Field of Search .................... 438/642, 637–639, 438/629, 381, 239, 243–244, 253; 257/68, 71

(56) References Cited

U.S. PATENT DOCUMENTS

| | | | | |
|---|---|---|---|---|
| 4,910,566 A | * | 3/1990 | Ema .......................... | 357/23.6 |
| 5,028,990 A | * | 7/1991 | Kotaki et al. ............... | 357/23.6 |
| 5,047,817 A | * | 9/1991 | Wakamiya et al. ......... | 357/23.6 |
| 5,126,916 A | * | 6/1992 | Tseng .......................... | 361/313 |
| 5,573,967 A | * | 11/1996 | Tseng .......................... | 437/52 |
| 5,710,074 A | * | 1/1998 | Tseng .......................... | 438/253 |
| 6,000,280 A | * | 12/1999 | Millet et al. .................. | 73/105 |
| 6,335,257 B1 | * | 1/2002 | Tseng .......................... | 438/397 |

OTHER PUBLICATIONS

Cho et al. "Anovel pillar dram cell for 4 gbit and beyond-"VLSI technology, 1998 Symposiun on, pg 38–39.*
Nakamura et al. "A simple 4 gbit dram technology utilizing high–aspect–ratio pillars cell–capacitors and peripheral–vias simultaneously fabricated" Electron device meeting 1997 technical digest p. 29–32.*

* cited by examiner

*Primary Examiner*—Matthew Smith
*Assistant Examiner*—Granvill D Lee
(74) *Attorney, Agent, or Firm*—Blakely, Sokoloff, Taylor & Zafman, LLP

(57) ABSTRACT

The present invention provides a method for manufacturing a plurality of buried metal lines on a semiconductor substrate. The method comprises the steps as below. A dielectric layer is formed on a semiconductor substrate. And a plurality of insulator blocks are formed on the dielectric layer, wherein each the insulator block has a width of 3 unit (3×), and each gap between two adjacent the insulator blocks has a width of 5 unit (5×). First sidewall spacers are formed on sidewalls of the insulator blocks, wherein each the first sidewall spacer has a width of 1 unit (1×). Then the plurality of the insulator blocks are removed, and second sidewall spacers are defined on sidewalls of the first sidewall spacers, wherein each the second sidewall spacer has a width of 1 unit (1×). Next studs are formed into gaps between two adjacent the second sidewall spacers, wherein each the stud has a width of 1 unit (1×). And the second sidewall spacers are removed. Then the dielectric layer is etched anisotropically to form a plurality of trenches in the dielectric layer by using said first sidewall spacers and the studs to serve as etching masks. A metal layer is deposited to fill into the trenches to form a plurality of metal lines.

16 Claims, 4 Drawing Sheets

METHOD OF MANUFACTURING BURIED METAL LINES HAVING ULTRA FINE FEATURES

FIELD OF THE INVENTION

The present invention relates to a semiconductor process, and more specifically, to a method of defining sidewall spacers repeatedly to form a plurality of buried metal line array on substrate.

BACKGROUND OF THE INVENTION

With the advance of integrated circuits technology into the ultra large scale integrated circuits (ULSI), the sizes of various devices have gotten smaller and smaller in order to manufacture the devices and the integrated circuits with high integration. However, when the scales of devices are getting smaller, many technical difficulties occur in performing the semiconductor processes. And the complexes of processes are also increasing.

In general, the key factor of techniques about integrated circuit designs is lithography process. Wherein the patterns of reticles can be transferred to the semiconductor substrate by using the lithography process to define patterns onto the material layers thereon and to frame the whole circuits structures. However as the sizes of devices continued shrinking, it is very difficult to pattern the reticles. And the difficulties to define fine patterns on substrate increases due to the restrictions such as the resolutions of lithography, the precision of pattern transferring, and the smaller space for using.

Especially for the integrated circuits, more than million devices and connections will be formed in the narrow and small area. Therefore various material layers and functional layers are stacked on the substrate in succession to form and define the desired devices. But when the density of these devices are increasing, the gaps among these devices are also getting narrow. Thus there are plenty of challenges encountered in manufacturing the metal lines to connect the devices.

Besides, the operating voltages, electric currents, and resistance of those devices must be controlled more critically to satisfy the fine integration circuits. So the areas of metal lines are increasing as large as possible to reduce the resistance therein and to promote the electric communications. However when the areas of metal patterns are too large, it is very difficult to manufacture other devices thereon. Thus how to form the metal patterns with large areas but occupying smaller space is becoming the important issue in the current semiconductor processes.

SUMMARY OF THE INVENTION

A method for manufacturing a plurality of buried metal lines on a semiconductor substrate is provided in this invention. The method comprises the following steps. First, a dielectric layer is formed on a semiconductor substrate. And a first insulator layer is formed on the dielectric layer to serve as an etching stop layer. Then, a second insulator layer is formed on the first insulator layer. And an etching procedure is done to etch the second insulator layer to define a plurality of insulator blocks on the first insulator layer, wherein each the insulator block has a width of 3 unit (3x), and each gap between two adjacent the insulator blocks has a width of 5 unit (5x). A first layer is deposited on outer surfaces of the insulator blocks, wherein the first layer has a width of 1 unit (1x). The first layer is next etched to form first sidewall spacers on sidewalls of the insulator blocks. And the plurality of the insulator blocks are removed, wherein each gap between two adjacent the first sidewall spacers has a width of 3 unit (3x). A second layer is deposited on outer surfaces of the first sidewall spacers, wherein the second layer has a width of 1 unit (1x). The second layer is etched to form second sidewall spacers on sidewalls of the first sidewall spacers. And a third layer is formed on outer surfaces of the second sidewall spacer and the first sidewall spacer, wherein materials of the third layer and the first layer are same, and the third layer has a width of 1 unit (1x). The third layer is then etched to form studs into gaps between two adjacent the second sidewall spacers, and to form third sidewall spacers on sidewalls of the peripheral second sidewall spacer. The second sidewall spacers are removed by using a selective etching to form gaps between adjacent the first sidewall spacer and the stud, wherein the gap has 1 unit (1x). The first insulator layer and the dielectric layer are etched to form a plurality of trenches in the dielectric layer by using said first sidewall spacers, the third sidewall spacers and the studs to serve as etching masks. The first sidewall spacers, the studs, the third sidewall spacers, and the first insulator layer are removed. And a metal layer is deposited to fill into the trenches to form a plurality of metal lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of manufacturing buried metal line array in trenches of a dielectric layer. A layer is first deposited on outer surfaces of insulator blocks defined on the dielectric layer. Then an etching procedure is done to define first sidewall spacers on the insulator blocks. After removing the insulator blocks, a second layer is deposited on the surfaces of first sidewall spacers. And another etching procedure is performed to define second sidewall spacers on the first sidewall spacers. By repeating above steps and adjusting the thickness of the deposited layers, the widths of the sidewall spacers can be controlled. Thus after repeating the above process several times, the width of the last formed sidewall spacers will be less than the limitations of the lithography. Then the sidewall spacers are used to serve as etching mask for etching the dielectric layer below to form a plurality of trenches with fine width. Next a metal layer is deposited on the dielectric layer and a CMP procedure is done to define the buried metal line array therein. The detailed processes will be described as follows.

Figure 1:
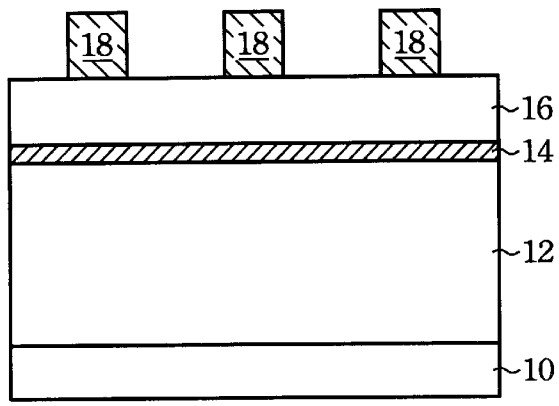
FIG. 1 is a cross sectional view of a semiconductor wafer illustrating the steps of forming a first insulator layer, a second insulator layer and a photoresist layer sequentially on a semiconductor substrate.

Referring to FIG. 1, in the preferred embodiment, a silicon substrate 10 is provided with <100> crystallographic orientation. In general, various semiconducting materials, such as gallium arsenide, germanium or silicon on insulator (SOI) can be chosen to serve as the substrate 10. Besides, any other suitable orientation such as <110> or <111> is useful due to the surface property is not critical in the present invention.

Then a dielectric layer 12 is formed on the substrate 10. In a preferred embodiment, the dielectric layer 12 is formed of silicon oxide and has a thickness about 3000 to 12000 angstroms. As is known in the art, the silicon dioxide layer 4 can be formed by using chemical vapor deposition (CVD) process, using TEOS as a source at a temperature between about 600 to 800° C., at a pressure 0.1 to 10 torrs. And note that, before depositing the dielectric layer 12, various active devices, passivated devices, and peripheral circuits can be defined on the substrate 10 in advance. Namely there are several function layers and material layers deposited and defined on the substrate 10.

Next a first insulator layer 14 is formed on the dielectric layer 12. In a preferred embodiment, the first insulator layer 14 is formed of silicon nitride and has a thickness about 300 to 800 angstroms. In a preferred embodiment, the silicon nitride layer 14 is deposited at a temperature of about 400 to 450° C. by using reactive gases comprise of $SiH_4$, $N_2O$ and $NH_3$. The first insulator layer 14 is served as an etching stop layer to prevent the underneath dielectric layer 12 from undesired erosions in latter etching steps.

A second insulator layer 16 is next formed on the first insulator layer 14. In a preferred embodiment, the second insulator layer 16 is formed of doped silicon oxide and has a thickness about 500 to 3000 angstroms. Thus the etching rate of the second insulator layer 16 is rather higher than that of the undoped silicon oxide when the HF solution is used as etchant. Then a photoresist layer 18 is coated on the second insulator layer 16. And the well-known procedures, such as exposure, development, cleaning . . . are performed to define the block pattern therein as shown in FIG. 1.

Figure 2:
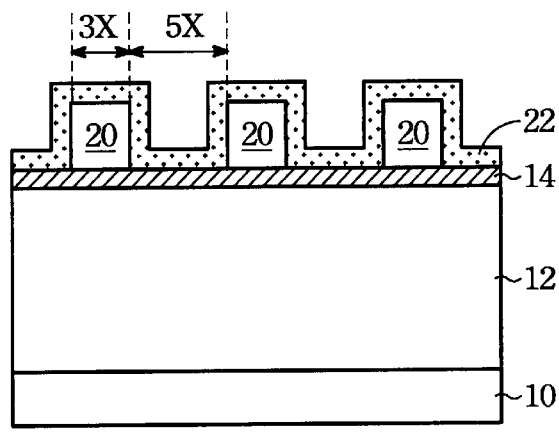
FIG. 2 is a cross sectional view of a semiconductor wafer illustrating the step of forming a first layer on insulator blocks.

Referring to FIG. 2, after defining the patterns of the photoresist layer 18, the second insulator layer 16 is etched until reaching the top surface of the first insulator layer 14 by using the photoresist layer 18 as an etching mask. Thus, the patterns defined in the photoresist layer 18 can be transferred to the second insulator layer 16 to form a plurality of insulator blocks 20 as shown in FIG. 2. In a preferred embodiment, every insulator block 20 has a width about 3 unit (3x), and the gap width between two adjacent insulator blocks 20 is about 5 unit (5x). In general, when the second insulator layer 16 is formed of silicon oxide, the etchants can be chosen from a group of $CCl_2F_2$, $CHF_3/CF_4$, $CHF_3/O_2$, $CH_3CHF_2$, and $CF4/O_2$.

Then, a first layer 22 is deposited uniformly on outer surfaces of the insulator blocks 20 and the first insulator layer 14. Preferably the first layer 22 is formed of polysilicon. And the thickness of first layer 22, referring to the thickness of insulator blocks 20, is adjusted about 1 unit (1x). In the embodiment here, the thickness of the first layer 22 is about 100 to 500 angstroms.

Figure 3:
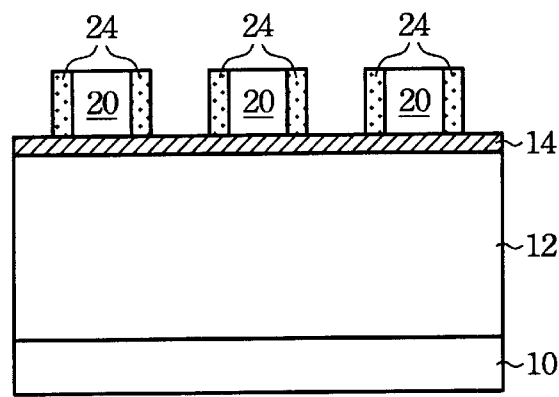
FIG. 3 is a cross sectional view of a semiconductor wafer illustrating the step of defining first sidewall spacers on sidewalls of the insulator blocks.

Referring to FIG. 3, next the first layer 22 is etched back anisotropically to form first sidewall spacers 24 on sidewalls of the insulator blocks 20. When the first layer 22 is formed of polysilicon, the etchants can be chosen from the group of $SiCl_4/Cl_2$, $BCl_3/Cl_2$, $HBr/Cl_2/O_2$, $HBr/O_2,Br_2/SF_6$, and $SF_6$. And the reactive ion etching procedure can be used to etch the first layer 22 in this step.

Figure 4:
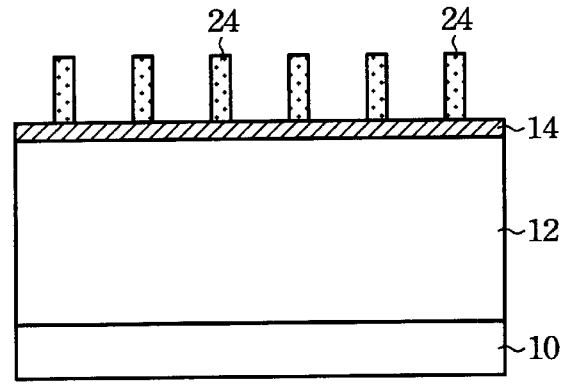
FIG. 4 is a cross sectional view of a semiconductor wafer illustrating the step of removing the insulator blocks.

Referring to FIG. 4, then a selective etching procedure is performed to remove all the insulator blocks 20 on the substrate 10. Thus only the first sidewall spacers 24 having the width 1 unit (1x) remained on the first insulator layer 14. And every spacing between two adjacent the first sidewall spacers 24 is about 3 unit (3x). When the insulator blocks 20 is formed of doped silicon oxide, the diluted HF solution can be used to serve as etchant. By using the higher etching selectivity to doped silicon oxide, the first sidewall spacers 24 and the first insulator layer 14 can be protected from erosions in the procedure of removing the insulator blocks 20.

Figure 5:
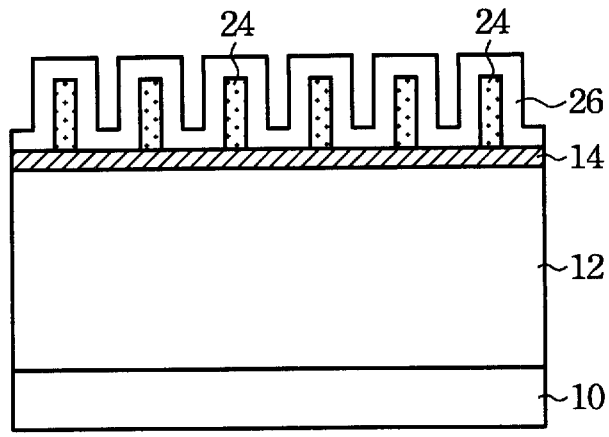
FIG. 5 is a cross sectional view of a semiconductor wafer illustrating the step of forming a second layer on the first sidewall spacers.

Referring to FIG. 5, after removing the insulator blocks 20, a second layer 26 is deposited uniformly on outer surfaces of the first sidewall spacers 24, the first insulator layer 14. The second layer 26 is preferably formed of doped silicon oxide. And the thickness of the second layer 26 is controlled about 1 unit (1x). In a preferred embodiment, the thickness of second layer 26 is adjusted about 100 to 500 angstroms.

Figure 6:
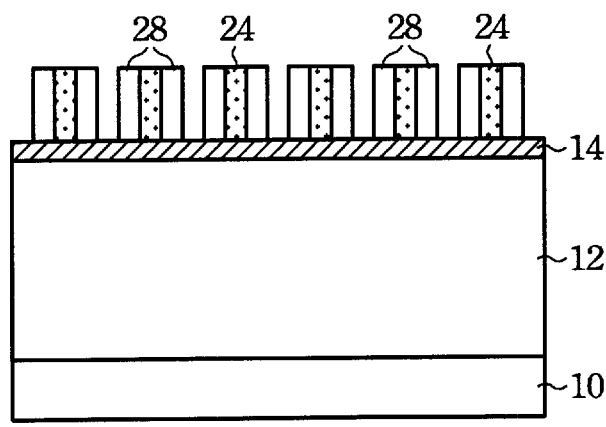
FIG. 6 is a cross sectional view of a semiconductor wafer illustrating the step of defining second sidewall spacers on sidewalls of the first sidewall spacers.

Next as shown in FIG. 6, an etching back procedure is performed to etch the second layer 26 for defining second sidewall spacers 28 on sidewalls of each the first sidewall spacer 24. And because the widths of the first sidewall spacer 24 and the second sidewall spacer 28 both are about 1 unit (1x), the gap width between two adjacent the second sidewall spacers 28 is 1 unit (1x). In an embodiment, the anisotropic etching process, such as RIE, can be used to etch the second layer 26. And the etchants can be chosen from the group of $CHF_3/CF_4$, $CHF_3/O_2$, $CF_4/O_2$, $C_4F_8/O_2$, $CH_2F_2$, and $C_4F_8$.

Figure 7:
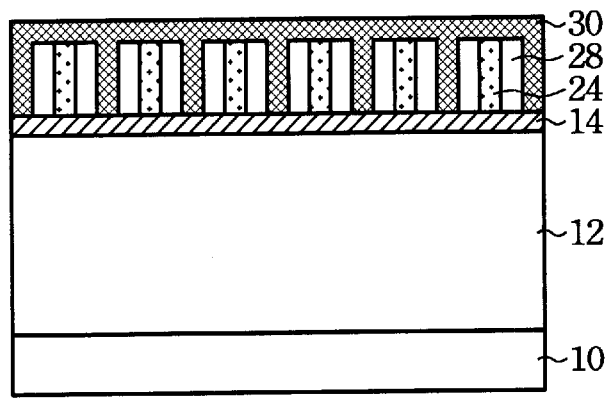
FIG. 7 is a cross sectional view of a semiconductor wafer illustrating the step of forming a third layer to cover the first sidewall spacers and the second sidewall spacers.

Then referring to FIG. 7, a third layer 30 is deposited on the first insulator layer 14, the first sidewall spacers 24 and the second sidewall spacers 28, and filled into the gaps between two adjacent the second sidewall spacers 28. In a preferred embodiment, the width of third layer 30 is about 100 to 500 angstroms, and the third layer 30 is formed of polysilicon.

Figure 8:
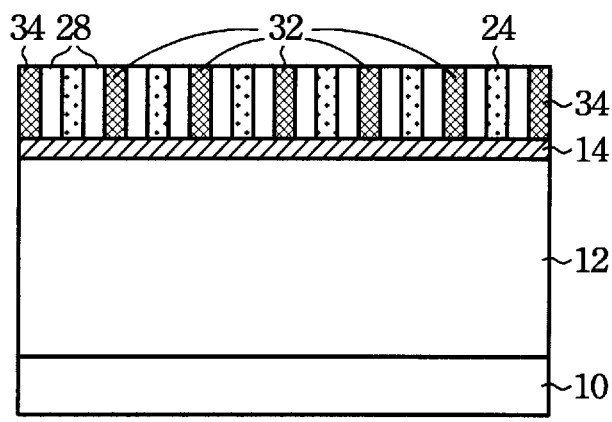
FIG. 8 is a cross sectional view of a semiconductor wafer illustrating the step of defining studs and third sidewall spacers on the second sidewall spacers.

Next, as shown in FIG. 8, an etching back procedure is performed to etch the third layer 30 until reaching top surfaces of the first sidewall spacers 24 and the second sidewall spacers 28 to remove a portion of the third layer 30 thereon. Thus this etching step can be used to define studs 32 in the gaps between two adjacent the two sidewall spacers 28 and to define third sidewall spacers 34 on outward sidewalls of the peripheral second sidewall spacers 28.

Figure 9:
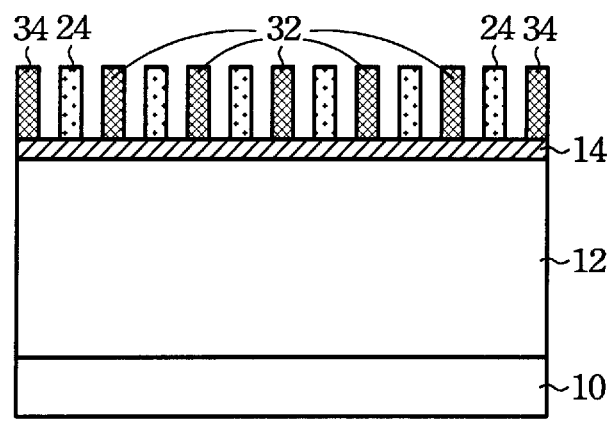
FIG. 9 is a cross sectional view of a semiconductor wafer illustrating the step of removing the second sidewall spacers.

Referring to FIG. 9, a selective etching procedure is then preformed to remove the second sidewall spacers 28 between the first sidewall spacer 24 and the stud 32 while to remove the second sidewall spacers 28 between the first sidewall spacer 24 and the third sidewall spacer 34. When the second sidewall spacers 28 are formed of doped silicon oxide, the HF vapor can be used to serve as etchant for removing the second sidewall spacers 28 completely. And the first sidewall spacers 24, the third sidewall spacers 34 and the studs 32 won't be corroded because they are formed of polysilicon. Thus, as shown in FIG. 9, gaps with width of 1 unit (1×) are defined between two adjacent the first sidewall spacer 24 and the stud 32(including the third sidewall spacers 34).

Figure 10:
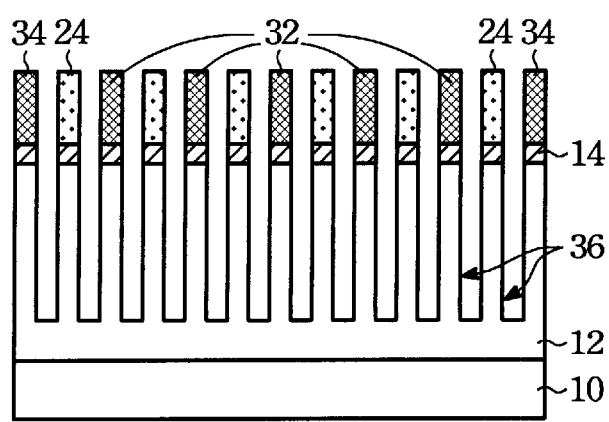
FIG. 10 is a cross sectional view of a semiconductor wafer illustrating the step of etching a dielectric layer to define a plurality of fine trenches therein.

Then referring to FIG. 10, an anisotropic etching procedure is done to etch the exposed first insulator layer 14 and underneath dielectric layer 12 to define a plurality of fine trenches 36 in the dielectric layer 12 by using the first sidewall spacers 24, the studs 32 and the third sidewall spacers 34 to serve as etching masks. The plasma etching processes such as RIE can be used in this step to remove the first insulator layer 14 and the dielectric layer 12 sequently.

Figure 11:
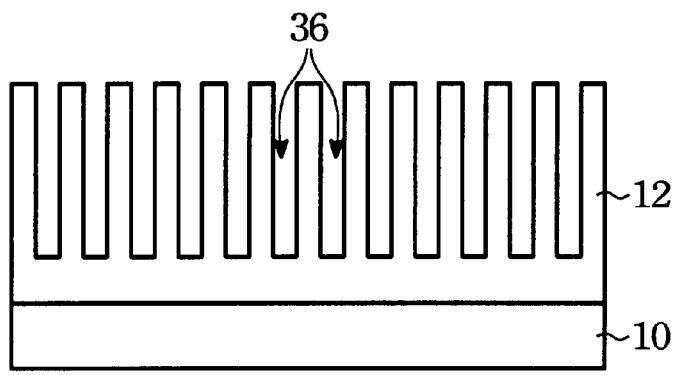
FIG. 11 is a cross sectional view of a semiconductor wafer illustrating the step of removing the etching masks above the dielectric layer.
Figure 12:
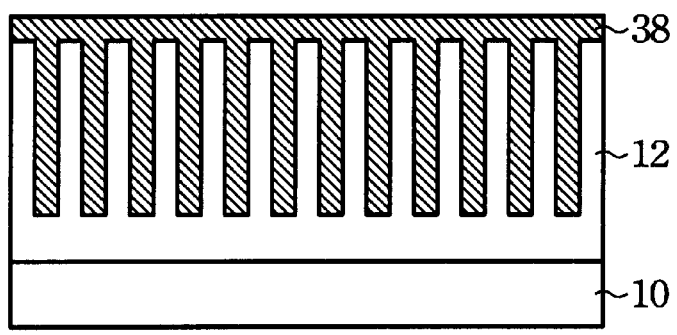
FIG. 12 is a cross sectional view of a semiconductor wafer illustrating the step of depositing metal layer on the dielectric layer.

Referring to FIG. 11, the first sidewall spacers 24, the third sidewall spacers 34, the studs 32 and the residual first insulator layer 14 are all removed to expose the top surfaces of the dielectric layer 12. And next a metal layer 38 is deposited on the dielectric layer 12 and filled into the trenches 36, as shown in FIG. 12.

Figure 13:
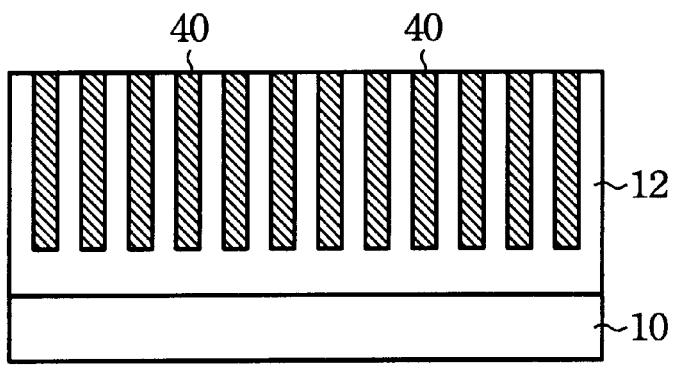
FIG. 13 is a cross sectional view of a semiconductor wafer illustrating the step of defining buried fine metal lines in the dielectric layer.

Referring to FIG. 13, a chemically mechanic polishing (CMP) procedure is performed to remove partial the metal layer 38 until reaching the dielectric layer 12 to define the ultra fine buried metal lines 40 therein. Each metal line 40 has the width about 1 unit (1×) and separated from another adjacent metal line 40 by the partial dielectric layer 12 with width of 1 unit (1×).

By using the method provided above, the fine metal lines 40 have the smaller widths under the limitations of the current photolithography process. As the description above, only one lithography procedure i s required to define the insulator blocks 20 with the width about 3 unit. Then the widths of the sidewall spacers can be adjusted by controlling the thickness of the deposited layers. Thus by depositing layers and defining sidewall spacers repeatedly, the sidewall spacers have the widths less than 3 unit can be defined on the substrate to reduce the sizes of devices.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a plurality of buried metal lines on a semiconductor substrate, the method comprises the steps of:

forming a dielectric layer on a semiconductor substrate;

forming a plurality of insulator blocks on said dielectric layer, wherein each said insulator block has a width of 3 unit (3×), and each gap between two adjacent said insulator blocks has a width of 5 unit (5×);

forming first sidewall spacers on sidewalls of said insulator blocks, wherein each said first sidewall spacer has a width of 1 unit (1×);

removing said plurality of said insulator blocks;

forming second sidewall spacers on sidewalls of said first sidewall spacers, wherein each said second sidewall spacer has a width of 1 unit (1×);

forming studs into gaps between two adjacent said second sidewall spacers, wherein each said stud has a width of 1 unit (1×);

removing said second sidewall spacers;

etching said dielectric layer anisotropically to form a plurality of trenches in said dielectric layer by using said first sidewall spacers and said studs to serve as etching masks; and filling metal into said trenches to form a plurality of metal lines.

2. The method of claim 1, wherein said dielectric layer is formed of silicon oxide.

3. The method of claim 1, wherein said first sidewall spacers are formed of polysilicon.

4. The method of claim 1, wherein said second sidewall spacers are formed of doped silicon oxide.

5. The method of claim 1 further comprising a step to form a silicon nitride layer on said dielectric layer before forming said insulator blocks, wherein said silicon nitride layer is used to serve as an etching stop layer to protect said underneath dielectric layer.

6. The method of claim 1, wherein each said trench has a width of 1 unit (1×).

7. The method of claim 1, wherein said insulator blocks are formed of doped silicon oxide.

8. The method of claim 1, wherein each said metal line has a width of 1 unit (1×).

9. A method for manufacturing a plurality of buried metal lines on a semiconductor substrate, the method comprises the steps of:

forming a dielectric layer on a semiconductor substrate;

forming a first insulator layer on said dielectric layer to serve as an etching stop layer;

forming a second insulator layer on said first insulator layer;

etching said second insulator layer to define a plurality of insulator blocks on said first insulator layer, wherein each said insulator block has a width of 3 unit (3×), and each gap between two adjacent said insulator blocks has a width of 5 unit (5×);

depositing a first layer on outer surfaces of said insulator blocks, wherein said first layer has a width of 1 unit (1×);

etching said first layer to form first sidewall spacers on sidewalls of said insulator blocks;

removing said plurality of said insulator blocks, wherein each gap between two adjacent said first sidewall spacers has a width of 3 unit (3×);

depositing a second layer on outer surfaces of said first sidewall spacers, wherein said second layer has a width of 1 unit (1×);

etching said second layer to form second sidewall spacers on sidewalls of said first sidewall spacers;

forming a third layer on outer surfaces of said second sidewall spacer and said first sidewall spacer, wherein materials of said third layer and the first layer are same, and said third layer has a width of 1 unit (1×);

etching said third layer to form studs into gaps between two adjacent said second sidewall spacers, and to form third sidewall spacers on outward sidewalls of said peripheral second sidewall spacer;

removing said second sidewall spacers by using a selective etching to form gaps between adjacent said first sidewall spacer and said stud, wherein said gap has 1 unit (1×);

etching said first insulator layer and said dielectric layer to form a plurality of trenches in said dielectric layer by using said first sidewall spacers, said third sidewall spacers and said studs to serve as etching masks;

removing said first sidewall spacers, said studs, said third sidewall spacers, and said first insulator layer; and filling metal into said trenches to form a plurality of metal lines.

10. The method of claim 9, wherein said dielectric layer is formed of silicon oxide.

11. The method of claim 9, wherein said first layer and said third layer are formed of polysilicon.

12. The method of claim 9, wherein said second layer are formed of doped silicon oxide.

13. The method of claim 9, wherein said first insulator layer is formed of silicon nitride.

14. The method of claim 9, wherein said second insulator layer is formed of silicon oxide.

15. The method of claim 9, wherein each said metal line has a width of 1 unit (1×).

16. The method of claim 9, wherein said step to define said metal lines further comprises following steps:

depositing a metal layer on said dielectric layer and filling into said plurality of trenches; and performing a CMP procedure to remove a portion of said metal layer above said dielectric layer to define said metal lines in said trenches.

* * * * *